(12) United States Patent
Yoder et al.

(10) Patent No.: US 7,605,962 B2
(45) Date of Patent: Oct. 20, 2009

(54) VIDEO PROCESSOR ALIGNMENT CLAMPING

(75) Inventors: Mark Alan Yoder, Carmel, IN (US); Scott Allen Bottler, Avon, IN (US)

(73) Assignee: Thomson, Boulogne-Billancourt (FR)

( * ) Notice: Subject to any disclaimer, the term of this patent is extended or adjusted under 35 U.S.C. 154(b) by 500 days.

(21) Appl. No.: 10/589,373

(22) PCT Filed: Mar. 11, 2005

(86) PCT No.: PCT/US2005/008261

§ 371 (c)(1),
(2), (4) Date: Aug. 15, 2006

(87) PCT Pub. No.: WO2005/094087

PCT Pub. Date: Oct. 6, 2005

(65) Prior Publication Data

US 2008/0225185 A1    Sep. 18, 2008

Related U.S. Application Data

(60) Provisional application No. 60/554,743, filed on Mar. 19, 2004.

(51) Int. Cl.
*G02B 26/08* (2006.01)
*G02B 7/00* (2006.01)

(52) U.S. Cl. .................................. 359/198; 359/818
(58) Field of Classification Search ................. 359/198, 359/290–292, 295, 811, 818
See application file for complete search history.

(56) References Cited

U.S. PATENT DOCUMENTS

| 5,526,172 | A | 6/1996 | Kanack |
| 5,535,047 | A | 7/1996 | Hombeck |
| 6,618,186 | B2 | 9/2003 | Kaeriyama |
| 6,625,021 | B1 | 9/2003 | Lofland et al. |
| 6,710,909 | B2 | 3/2004 | Naito |
| 2003/0063247 | A1 | 4/2003 | Kalyandurg |
| 2004/0004676 | A1 | 1/2004 | Kinm |

OTHER PUBLICATIONS

Search Report dated Jun. 7, 2005.

*Primary Examiner*—William C Choi
(74) *Attorney, Agent, or Firm*—Robert D. Shedd; Harvey D. Fried; Patricia Verlangieri

(57) ABSTRACT

A clamping spring (70) formed of a sheet of resilient material having an interconnected plurality of alternating first and second tabs disposed around the periphery thereof is disclosed. The first tabs (72) being angled upwardly and having mounting slots (73) therein. The second tabs (74) being angled downwardly. A force applied to the first tabs provides a consistent controlled clamping force at the second tabs.

9 Claims, 2 Drawing Sheets

VIDEO PROCESSOR ALIGNMENT CLAMPING

CROSS-REFERENCE TO RELATED APPLICATIONS

This application claims the benefit, under 35 U.S.C. § 365 of International Application PCT/US05/08261 filed Mar. 11, 2005, which was published in accordance with PCT Article 21(2) on Oct. 6, 2005 in English and which claims the benefit of U.S. provisional patent application No. 60/554,743 filed Mar. 19, 2004.

FIELD OF THE INVENTION

The invention relates generally to a digital light processing (DLP™) projection system for use with a microdisplay.

BACKGROUND OF THE INVENTION

At the core of every digital light processing (DLP™) projection system is an optical semiconductor known as a digital micromirror device (DMD) chip. The mechanical alignment of the DMD chip to the rest of the light engine is critical to properly locating the picture onto the screen.

A special fixture or machine is required to align the DMD assembly (including the heatsink and PC board) to the core optics array. Features are typically built into the assembly for the machine to manipulate the DMD chip so as to align it.

Existing light engine designs hard mount the DMD assembly to the optics housing and then adjust the optical system around the chip position. Since, this alignment is performed visually on the screen by an operator the electronics are live during this alignment and the DMD chip needs to be in focus for the alignment to be performed properly.

SUMMARY

The present invention provides a clamping spring, including a sheet of resilient material having an interconnected plurality of alternating first and second tabs disposed around the periphery thereof. The first tabs being angled upwardly and having mounting slots therein. The second tabs being angled downwardly. A force applied to the first tabs provides a consistent controlled clamping force at the second tabs. In a further embodiment, the present invention provides a clamping arrangement, wherein a DMD assembly is clamped together by a plurality of first shoulder bolts with coil springs thereon and the DMD assembly is clamped to an optics housing by a spring and a plurality of second shoulder bolts extending through longitudinal apertures in the first shoulder bolts.

BRIEF DESCRIPTION OF THE DRAWINGS

The invention will now be described with reference to the accompanying drawing figures, of which.

DETAILED DESCRIPTION

The present invention provides a controlled clamping force to a DMD assembly, so that it remains in place between the production steps of DMD alignment and the final clamping of the screws. It also provides a positive Z-axis bias to the assembly, to eliminate any tolerance in that direction. The DMD needs to be in the correct Z-axis position throughout the alignment process to keep the picture on the screen in focus. In an exemplary embodiment of the present invention, this clamping action is accomplished using a stamped steel leaf spring. This spring system applies adequate pressure to the DMD to keep it in proper focus, as well as to hold it in place between alignment and final clamping.

In the present light engine design, the core optics assembly is fixed in location. Therefore, it is necessary to adjust the DMD to the optics for picture alignment.

Figure 1:
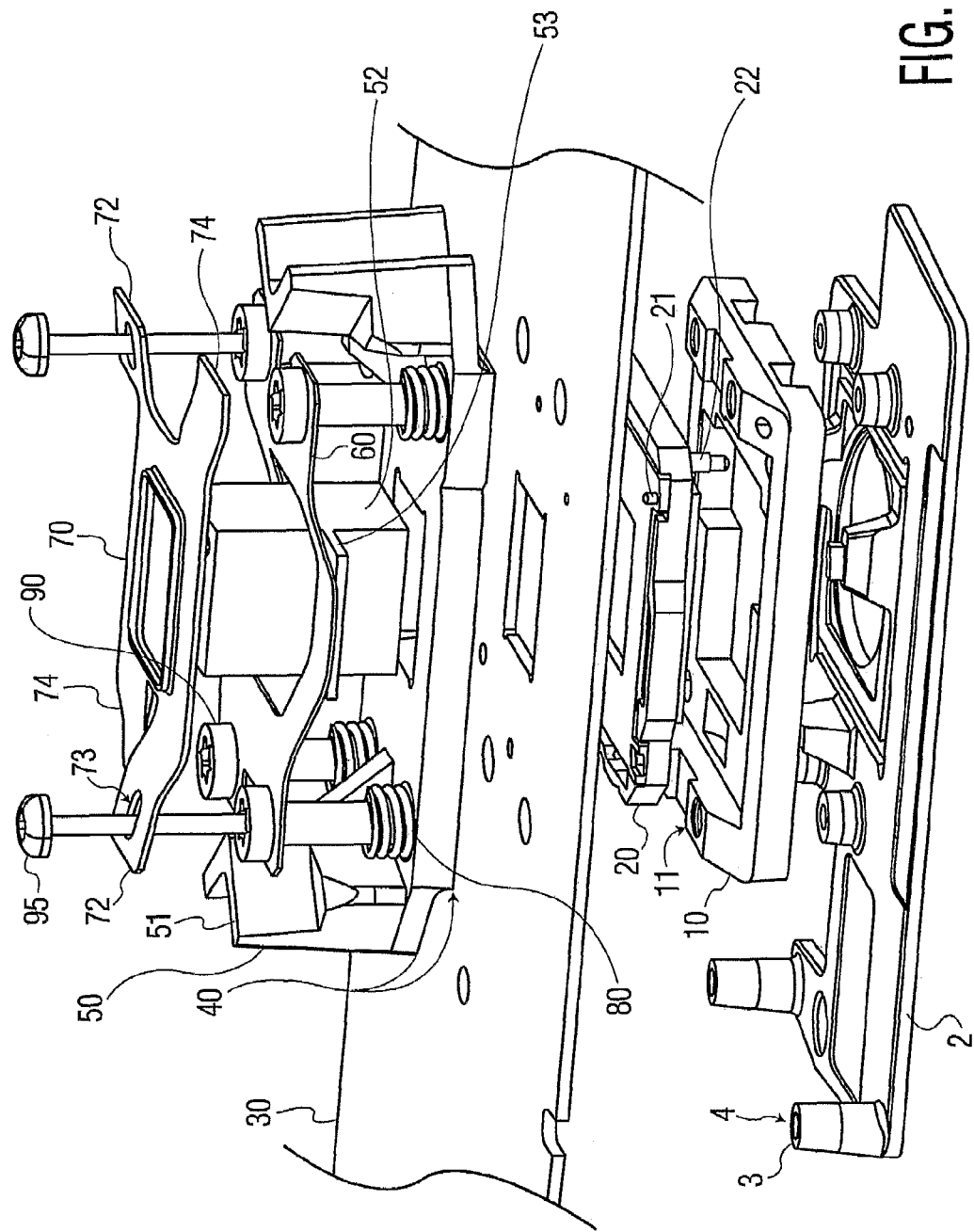
FIG. 1 shows an exploded view of a DMD clamping assembly for video processor alignment according to an exemplary embodiment of the present invention.

According to an exemplary embodiment, the present invention uses a stamped steel piece to act as a leaf spring 70, as shown in FIG. 1. The spring 70 is compressed by two shoulder screws 95, which apply a prescribed loading to a DMD assembly for holding it to the optics housing 2. With this loading applied, the DMD assembly has enough freedom to be manipulated by an alignment machine, but will still be held in place until the system can be locked down.

The DMD assembly, as shown in FIG. 1 includes a DMD chip (not shown) that is mounted in an interposer 20 and operatively connected to a printed circuit board (PCB) 30. An interposer clamp 10 is positioned against the interposer 20 opposite the PCB 30. The interposer 20 is aligned with the PCB 30 and the interposer clamp 10 by pins 21, 22. A backer plate 50 is positioned on the PCB 30 opposite the interposer 20 with an insulator 40 between the backer plate 50 and the PCB 30. The backer plate 50 has holding structures 51 for use by the alignment machine to hold the DMD assembly. The DMD assembly is clamped together by first shoulder bolts 90 that pass through mounting holes in the backer plate 50, the insulator 40, and the PCB 30, and are then threaded into threaded holes 11 formed in the interposer clamp 10. Compression springs 80 are provided on the first shoulder bolts 90 to provide resilient clamping force on the DMD assembly when the first shoulder bolts are torqued down.

In the embodiment shown in FIG. 1, a heat slug 52 is provided to transfer heat from the DMD chip. The heat slug 52 extends through openings in the backer plate 50, insulator 40, and PCB 30, and has a flange 53 that rests against the backer plate 50. The heat slug is biased against the backer plate 50 by a leaf spring 60 that is held in place by the first shoulder bolts 90.

As shown in FIG. 1, the DMD assembly is held in place and biased in the Z-axis direction by a clamping spring 70. The clamping spring 70 comprises a sheet of resilient material, such as steel, for example. The clamping spring 70 has an interconnected plurality of alternating first and second tabs 72, 74 disposed around the periphery of the clamping spring 70. In the exemplary embodiment illustrated in FIG. 1, two first tabs 72 and two second tabs 74 are provided, with one of each tab on each end of a rectangular body having an opening for the heat slug 52. The first tabs 72 are angled upwardly and have mounting slots 73 in them. The second tabs 74 are angled downwardly. When force is applied to the first tabs 72, the clamping spring 70 provides a consistent controlled clamping force at the second tabs 74.

Figure 2:
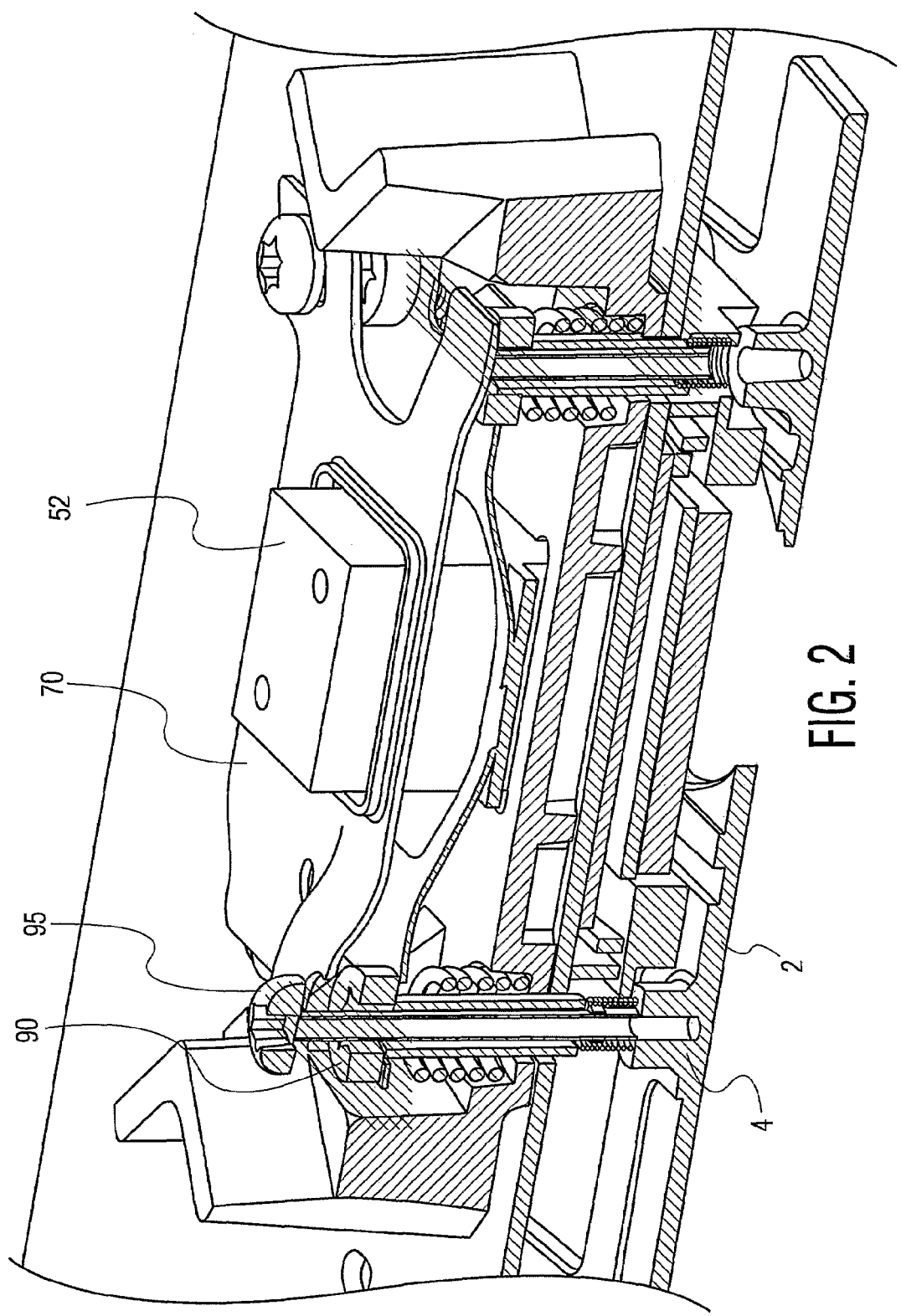
FIG. 2 an exploded view of the clamping assembly of FIG. 1 taken generally along axis 2-2 in FIG. 1.

The optical housing 2, has bosses 3 for supporting the DMD assembly. Threaded holes 4 are formed in the bosses 3. As best shown in FIG. 2, the first shoulder bolts 90 are hollow, having an aperture extending through the first shoulder bolt 90 along its longitudinal axis. The second shoulder bolts 95 are placed through the slots 73 in the clamping spring 70 and the apertures in the first shoulder bolts 90, then threaded into the threaded holes 4 in the bosses 3 of the optical housing 2.

In another embodiment of the invention (not illustrated), four coil springs and four shoulder screws are used to provide force to the system. In this embodiment, there is considerable tolerance in the force/deflection curves of the coil springs. Because the four springs act independently, there can be more or less force applied at some of the locations.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

We claim:

1. A clamping arrangement for a microdisplay, comprising:
   a clamping spring, having a sheet of resilient material with an interconnected plurality of alternating first and second tabs disposed around the periphery thereof, the first tabs being angled upwardly and having mounting slots therein, the second tabs being angled downwardly; whereby force applied to said first tabs provides a consistent controlled clamping force at said second tabs;
   a digital micromirror device assembly, secured by a plurality of first shoulder bolts having apertures extending along axes of the bolts;
   an optical housing having a plurality of bosses supporting the digital micromirror device assembly with threaded apertures therein; and
   second shoulder bolts disposed through the slots of the clamping spring and the apertures of at least a portion of the first shoulder bolts and engaging the threaded apertures of at least a portion of the bosses.

2. The clamping arrangement of claim 1 wherein the first and second tabs are interconnected by a generally rectangular body having an opening therethrough.

3. The clamping arrangement of claim 1 wherein the resilient material is steel.

4. The clamping arrangement of claim 1 wherein there are two first tabs and two second tabs.

5. The clamping arrangement of claim 1 wherein the digital micromirror device assembly includes a digital micromirror device chip mounted in an interposer and electrically connected to a printed circuit board, the interposer and the printed circuit board being sandwiched between a backer plate and an interposer clamp, and the interposer being aligned with the printed circuit board and the interposer clamp by pins.

6. The clamping arrangement of claim 5 wherein the digital micromirror device assembly also includes coil springs disposed on the first shoulder bolts to bias the digital micromirror device assembly together.

7. A projection system, comprising:
   an optics housing having a plurality of bosses with threaded apertures therein;
   a digital micromirror device assembly clamped together with a plurality of first shoulder bolts with longitudinal opening therethrough;
   a clamping spring for biasing the digital micromirror device assembly against the optics housing; and
   two or more second shoulder bolts, engaging said clamping spring, extending through said opening in selected ones of said first shoulder bolts, and engaging said threaded apertures in said optics housing.

8. The projection system of claim 7 wherein the digital micromirror device assembly is biased against the optics housing by a clamping spring having a sheet of resilient material with an interconnected plurality of alternating first and second tabs disposed around the periphery thereof, the first tabs being angled upwardly and having mounting slots therein, the second tabs being angled downwardly; whereby force applied to said first tabs provides a consistent controlled clamping force at said second tabs.

9. The projection system of claim 7 wherein the digital micromirror device assembly is biased against the optics housing by a plurality of coil spring disposed on at least a portion of the second shoulder bolt.

* * * * *

UNITED STATES PATENT AND TRADEMARK OFFICE
CERTIFICATE OF CORRECTION

PATENT NO. : 7,605,962 B2  Page 1 of 1
APPLICATION NO. : 10/589373
DATED : October 20, 2009
INVENTOR(S) : Yoder et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 566 days.

Signed and Sealed this

Fifth Day of October, 2010

David J. Kappos
*Director of the United States Patent and Trademark Office*